United States Patent [19]
Sun

[11] Patent Number: 5,784,399
[45] Date of Patent: Jul. 21, 1998

[54] POLARIZATION MODE SELECTION BY DISTRIBUTED BRAGG REFLECTOR IN A QUANTUM WELL LASER

[75] Inventor: Decai Sun, Sunnyvale, Calif.

[73] Assignee: Xerox Corporation, Stamford, Conn.

[21] Appl. No.: 774,937

[22] Filed: Dec. 19, 1996

[51] Int. Cl.$^6$ .................................. H01S 3/19; H01L 29/06
[52] U.S. Cl. .................... 372/50; 372/43; 372/96; 372/102; 372/106; 257/14
[58] Field of Search .................. 372/43, 50, 46, 372/96, 102, 106, 109; 257/14, 15, 16, 17, 22, 37

[56] References Cited

U.S. PATENT DOCUMENTS

| | | | |
|---|---|---|---|
| 5,155,737 | 10/1992 | Ikeda et al. | 372/43 |
| 5,384,797 | 1/1995 | Welch et al. | 372/23 |
| 5,396,508 | 3/1995 | Bour et al. | 372/27 |
| 5,412,678 | 5/1995 | Treat et al. | 372/45 |
| 5,465,263 | 11/1995 | Bour et al. | 372/23 |
| 5,586,131 | 12/1996 | Ono et al. | 372/19 |
| 5,648,978 | 7/1997 | Sakata | 372/50 |

*Primary Examiner*—Brian Healy
*Attorney, Agent, or Firm*—William Propp

[57] ABSTRACT

In a quantum well semiconductor laser structure, a distributed Bragg reflector is used to select the polarization mode of the emitted light beam. The period of the distributed Bragg reflector matches the peak gain of one polarization mode providing optical feedback for that mode to be the light emitted. The distributed Bragg reflector can extend along the length of the active layer within the semiconductor structure or extend at one end of the active layer external to the semiconductor structure.

24 Claims, 4 Drawing Sheets

POLARIZATION MODE SELECTION BY DISTRIBUTED BRAGG REFLECTOR IN A QUANTUM WELL LASER

BACKGROUND OF THE INVENTION

This invention relates to a quantum well laser and, more particularly, to a quantum well laser with a distributed Bragg reflector (DBR) having different periods for emitting TE or TM polarized light.

There exist many applications for laser diodes and arrays of laser diodes that can emit polarized light or simultaneously or selectively emit separable light from different array elements. Examples are color printing, full color digital film, recording, color displays, multiple beam optical scanning systems, and optical recording and playback systems. Building a laser array into a monolithic structure in which the emitting regions are closely spaced offers a further important advantage that all of the optical sources can share a common lens system. It is also desirable in a number of these applications that the emitting regions in the monolithic structure are individually addressable, and it is also desirable to be able to individually detect such closely-spaced beams and process any information contained as a result of beam modulation at the source or by reflection or transmission through optical media.

There are several ways to generate light beams with a unique characteristic from a laser diode. One way is to control the polarization.

Quantum well (QW) lasers normally emit coherent light in the transverse electric (TE) polarization rather than the transverse magnetic (TM) polarization. In most semiconductor materials allowing heavy hole and light hole transition, the n=1 heavy hole transition is the fundamental (lowest energy) transition and the lowest energy state is the state whose population is most easily inverted. The heavy hole is lowest in energy because the quantum shifts are inversely proportional to the effective mass; therefore, the light hole levels are shifted to higher energy levels than the heavy hole levels.

In a quantum well laser, the TE-mode gain arises primarily from the heavy hole transition, while the TM-mode gain is provided mainly by the light hole transitions. Thus, most quantum well lasers emit light in the TM-mode. This is true for both unstrained GaAs/AlGaAs and compressively strained InGaAs/AlGaAs, InGaP/AlGaInP and InGaAs/InGaAsP/InP quantum well lasers.

Individually addressable quantum well (QW) lasers can however emit coherent light in the transverse electric (TE) or in the transverse magnetic (TM) mode. Quantum well (QW) lasers can switch from emitting coherent light in the TE polarization mode to the TM polarization mode, or vice versa. This ability to emit coherent light in either the TE or TM polarization states is accomplished in certain semiconductor material laser structures by controlling the type of strain induced in the epitaxially deposited active region due to lattice mismatches with the substrate.

TE polarization gain will predominate in most material systems allowing heavy hole and light hole transition, when the n=1 heavy hole is the lowest energy state and therefore the state whose population is most easily inverted, which is usually true for unstrained and compressively strained III-V alloy systems. However, by reversing the light hole and heavy hole band edges, achieved in certain semiconductor material laser structures by inducing tensile strain into the active region, TM polarization gain will predominate. In the degenerate condition, where the light hole and heavy hole bands are substantially coincident in energy, the polarization of the emission can be determined by threshold carrier density and other factors, such as temperature, facet reflectivity, cavity length and intracavity optical loss.

TM polarization can be obtained by subjecting the active layer to biaxial tension, parallel to the plane of the junction of the active layer and the cladding layers.

In general, the desired polarization mode laser emitter can be achieved with either a single quantum well, carefully adjusted, or separate quantum wells for TE and TM mode gain with the polarization mode of laser oscillation dependent upon the modal gain characteristics and the threshold gain. The necessary gain characteristic has one polarization with lowest transparency current, and the orthogonal polarization with a greater peak gain. For some range of active region parameters (thickness, composition, placement within the confining region, etc.), these characteristics can be obtained, and so the polarization will be determined by the threshold gain. Therefore, the polarization of each device can be selected, for example, by introducing an additional loss into one of the devices, thereby forcing it to emit coherent light in the higher-gain polarization.

On the other hand, a device without this additional loss will simply emit coherent light in the polarization which has lowest transparency current. The additional loss could be provided by an unpumped section along the cavity, low mirror reflectivity, shorter cavity, etc. Similarly, the polarization of each device could be switched, by using an intracavity loss modulator.

This polarization selectivity mechanism is demonstrated by the polarization-dependent gain-current characteristics shown in FIG. 1. Modal gain is plotted as a function of device current, for both the TM and TE modes. The modal gain, g, for both TM and TE modes is plotted vertically along the y coordinate, and current, I, for both modes is plotted horizontally along the x coordinate. The curve 1 labeled TE shows the gain characteristic for the TE-mode, and the curve 2 labeled TM shows the gain characteristic for the TM-mode. Under certain conditions, the quantum well, when caused to lapse at the lower threshold current 3 will emit TE-polarized radiation because the TE gain is higher for that current. Under other conditions, usually by introducing loss, when the threshold current exceeds the crossover 4, the quantum well will lase in the TM mode represented by the curve 5 because the TM-gain is higher for that current.

One means of selecting polarization for a quantum well laser is by increasing the reflectivity of the laser cavity for one polarization mode over the other polarization mode.

It is an object of this invention to provide a distributed Bragg reflector for polarization mode selection in a quantum well laser structure.

SUMMARY OF THE INVENTION

In accordance with the present invention, a distributed Bragg reflector in a quantum well semiconductor laser structure is used to select the polarization mode of the emitted light beam. The period of the distributed Bragg reflector matches the peak gain of one polarization mode providing optical feedback for that mode to be the light emitted. The distributed Bragg reflector can extend along the length of the active layer within the semiconductor structure or extend at one end of the active layer external to the semiconductor structure.

In a dual ridge semiconductor laser structure, one laser diode can emit TE-polarized light while the adjacent laser diode can emit TM-polarized light with different distributed Bragg reflectors but the same laser structure. Alternately, the same distributed Bragg reflector can be used for both laser diodes except the DBR is tilted at an angle in one diode causing the diode to emit TM-polarized light. Alternately, a single distributed Bragg reflector can be provided in one of the two laser diodes to emit TM-polarized light.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
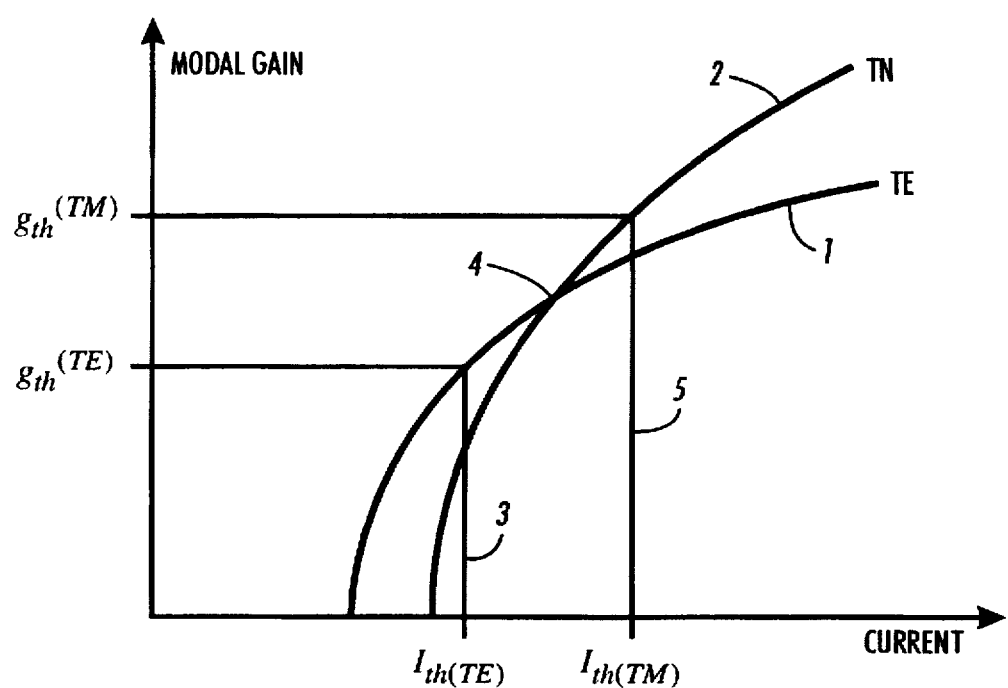
FIG. 1 is a graph showing the gain-current characteristic of a polarized semiconductor laser structure.
Figure 2:
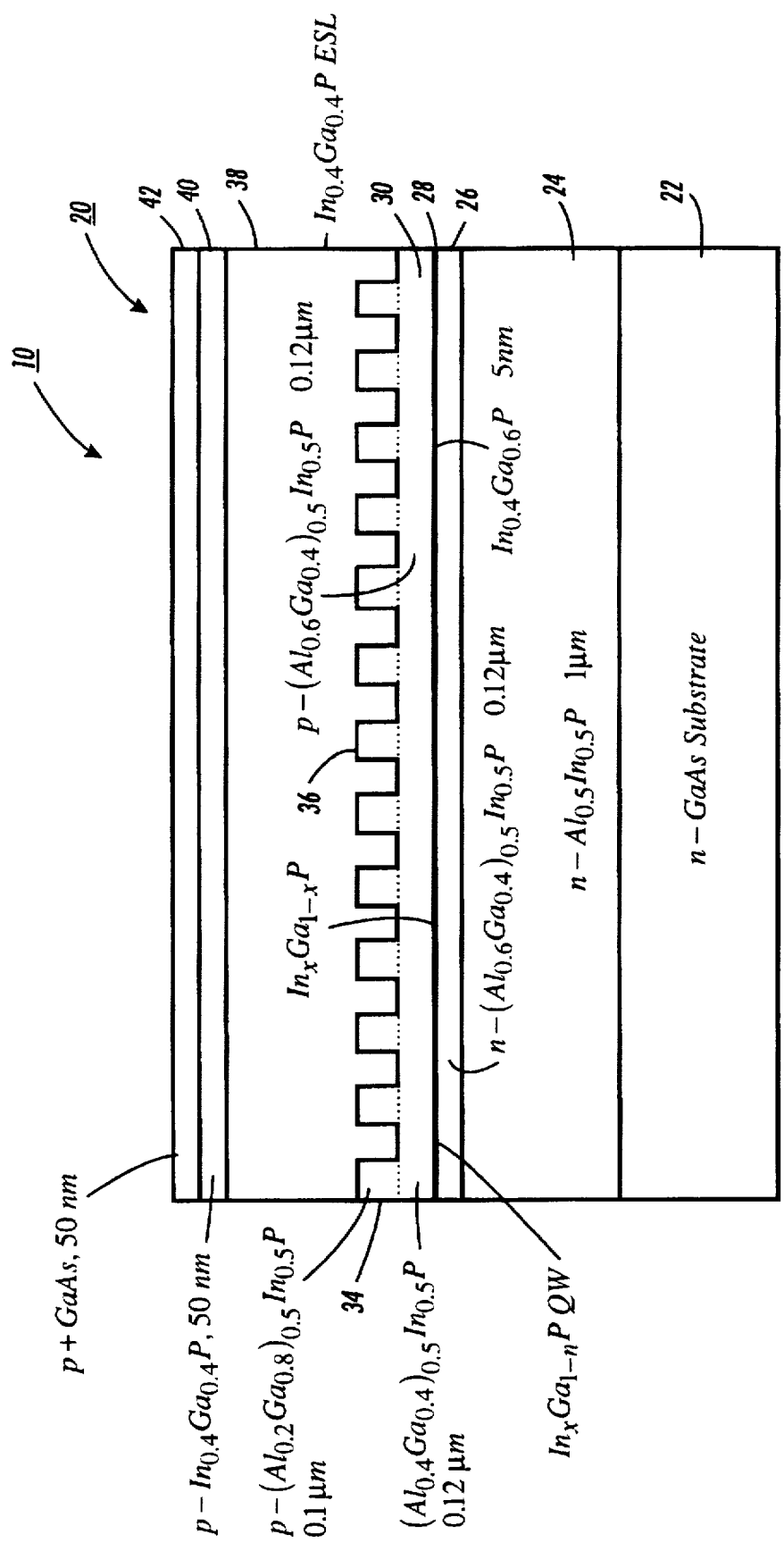
FIG. 2 is a schematic illustration of the cross-section side view of a first embodiment of a dual buried ridge semiconductor laser structure with DBRs for polarization mode selection formed according to the present invention.
Figure 3:
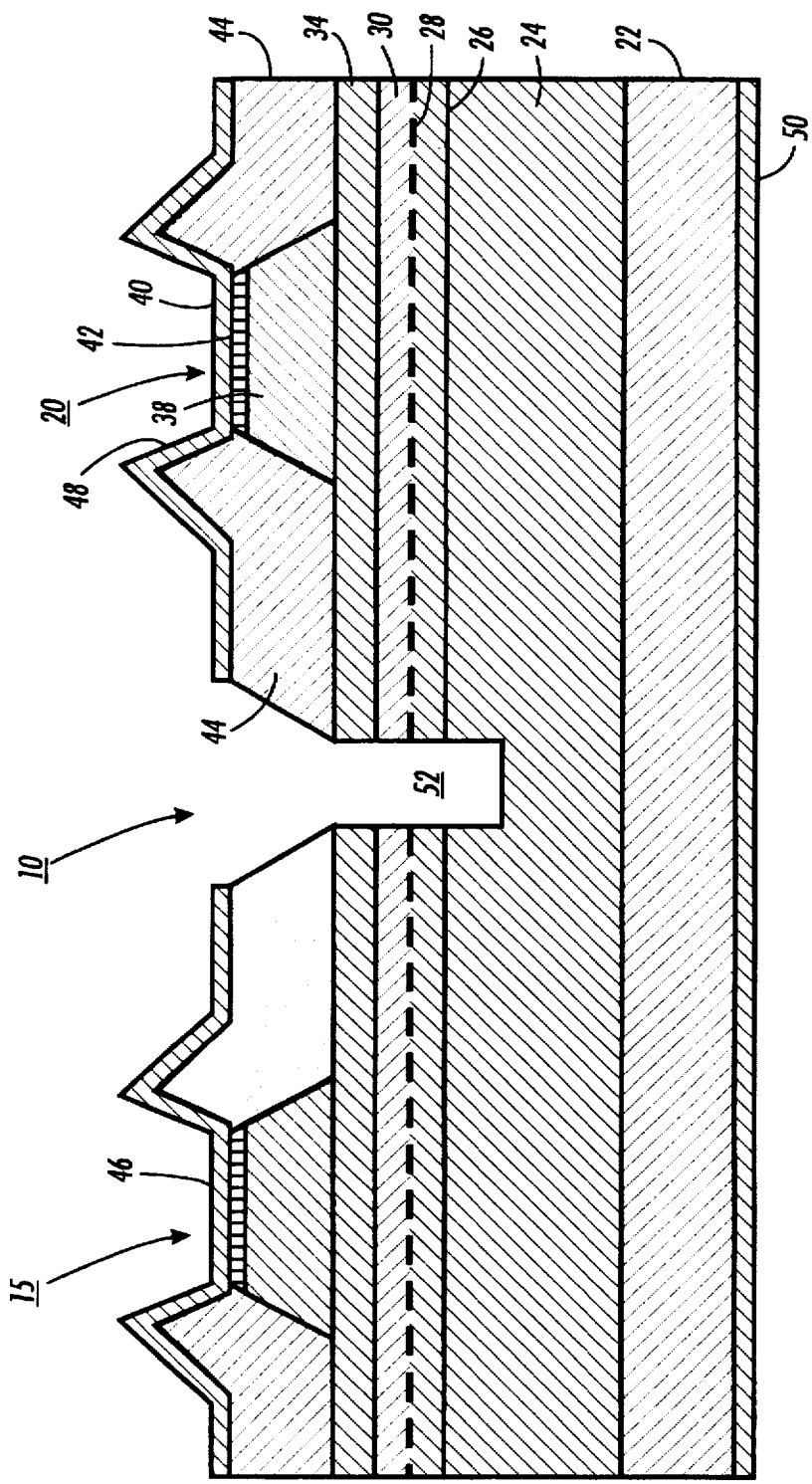
FIG. 3 is a schematic illustration of the cross-section end view of the dial buried ridge semiconductor laser structure with DBRs of FIG. 2.

Reference is now made to FIGS. 2 and 3 wherein there is described the dual ridge semiconductor diode laser structure 10 of the present invention. The dual ridge semiconductor diode laser structure 10 comprises a first laser diode 15 for emitting a TE-polarization mode beam and a second laser diode 20 for emitting a TM-polarization mode beam. The first and second laser diodes are fabricated side-by-side on a common substrate. Different polarizations within a closely spaced monolithic semiconductor structure would be employed to minimize optical interference in a practical use as a multiple beam light source. The two side-by-side diode laser structures 15 and 20 are fabricated the same way from the same materials with one exception, the DBR in each laser structure. This provides ease of manufacture at reduced expense.

The semiconductor laser structure 10 has a n-GaAs substrate 22 on which is epitaxially deposited, in a known manner such as metalorganic chemical vapor deposition (MOCVD), a succession of semiconductor layers comprising, in order, an n-$Al_{0.5}In_{0.5}P$ cladding layer 24 of 1 µm thickness, a n-$(Al_{0.6}Ga_{0.4})_{0.5}In_{0.5}P$ confinement layer 26 of 0.12 µm thickness, an $In_xGa_{1-x}P$ quantum well layer 28 where x >0.5 to induce tensile strain for the layer with a thickness of 8 nm, a p-$(Al_{0.6}Ga_{0.4})_{0.5}In_{0.5}P$ confinement layer 30 of 0.12 µm thickness, an $In_{0.4}Ga_{0.6}P$ etch stop layer 32 of 5 nm thickness and a p-$(Al_{0.2}Ga_{0.8})_{0.5}In_{0.5}P$ upper cladding layer 34 of 0.1 µm thickness. The x value and thickness of the $In_xGa_{1-x}P$ quantum well layer 28 can be adjusted based on the wavelength of the emitted light beam desired.

The AlGaInP/InGaP layers 26, 28 and 30 form a tensile strained quantum well heterostructure with an upper cladding layer 34. After growth of the $(Al_{0.2}Ga_{0.8})_{0.5}In_{0.5}P$ upper cladding layer 34, as best seen in FIG. 2, a mth order distributed Bragg reflector (DBR) grating 36 is fabricated in the upper cladding layer 34 using e-beam lithography and dry chemical etching. The DBR grating can be etched down to the etch stop layer 32 depending upon the optical requirements of the DBR.

The $m^{th}$ order DBR grating provides feedback of light in the associated quantum well active layer. Because it is difficult to directly etch the short grating periods needed to make first order diffraction gratings in short wavelength semiconductor materials, second or third order gratings are preferred. The period of each grating is tuned to the emission wavelength of the quantum well active layer. The grating areas coincide with the thinner cladding layer 34 for maximum grating coupling efficiency with the active layer for emission of light.

The $m^{th}$ order DBR grating 36 has a period of mλ/2n where m is the integer order and n is the index of refraction of the semiconductor material. The etched DBR gratings extend laterally to the quantum well layer 28 and also extend from end-to-end along the full length of the quantum well layer 28, thereby enabling the DBR grating to interact with the light emission from the quantum well layer along substantially the full length of the active region 28.

One grating period for the first laser matches the gain peak of the TE-mode of the quantum well layer 28 and the other grating period for the second laser matches the gain peak of the TM-mode of the quantum well layer 28. Assuming that the gain peaks of the TE and TM modes are 650 and 640 nm respectively, the period of a third order grating at 650 nm is 3λ/2n=304.6 nm and that at 640 nm is 300 nm, where n is the mean refractive index of $(Al_{0.2}Ga_{0.8})_{0.5}In_{0.5}P$ and $Al_{0.5}In_{0.5}P$, the two adjacent semiconductor materials.

The DBR grating need only extend far enough along the quantum well layer to shift the emitted light beam into one or the other polarization mode. Thus, the DBR grating only needs to extend partially along the quantum well layer.

After etching of the DBR grating 36, a p-$Al_{0.5}In_{0.5}P$ cladding ridge layer 38 of 1 µm thickness is epitaxially deposited on the upper cladding layer 34 (with its grating 36) followed by a p-$In_{0.4}Ga_{0.6}P$ barrier reduction layer 40 of 50 nm thickness, and a p+ GaAs cap layer 42 of 50 nm thickness. As best seen in FIG. 3, n-GaAs flanking layers 44 flanking the ridge 38 are selectively regrown.

A first p-ohmic metal electrode 46 is formed on the cap layer 42 of first laser diode 15 and a second p-ohmic metal electrode 48 is formed on the cap layer 42 of second laser diode 20 and a common n-ohmic contact metal electrode 50 is formed on the substrate 22 to provide the current injection for the active layers of the two laser diodes. Each diode has a separate pelectrode and is independently and individually addressable.

After the independently addressable contacts are defined for lasers 15 and 20, an isolation groove 52 is etched in order to optically, electrically, and thermally isolate the closely spaced lasers. The isolation groove 52 effectively eliminates electrical and optical crosstalk between the two adjacent, closely spaced laser diodes, so long as it extends through the laser active region into the cladding layer 24. To thermally isolate the closely spaced lasers, the isolation groove 48 must extend into the substrate 22.

Not shown in FIGS. 2 and 3 are the usual reflecting facets coated with anti-reflection coatings forming the laser cavity with and perpendicular to the quantum well active layer 28 at opposite ends of the laser structure 10.

The DBR grating 36 in the dual ridge diode laser structure 10 provides strong feedback (over 90 percent) for only either TE or TM polarization by matching the grating period to either polarization gain peak so a single polarization mode is selected.

The DBR grating does not have to extend along the entire length of the quantum well active layer to select the TE or TM polarization mode for the light emitted by that quantum well active layer.

Figure 4:
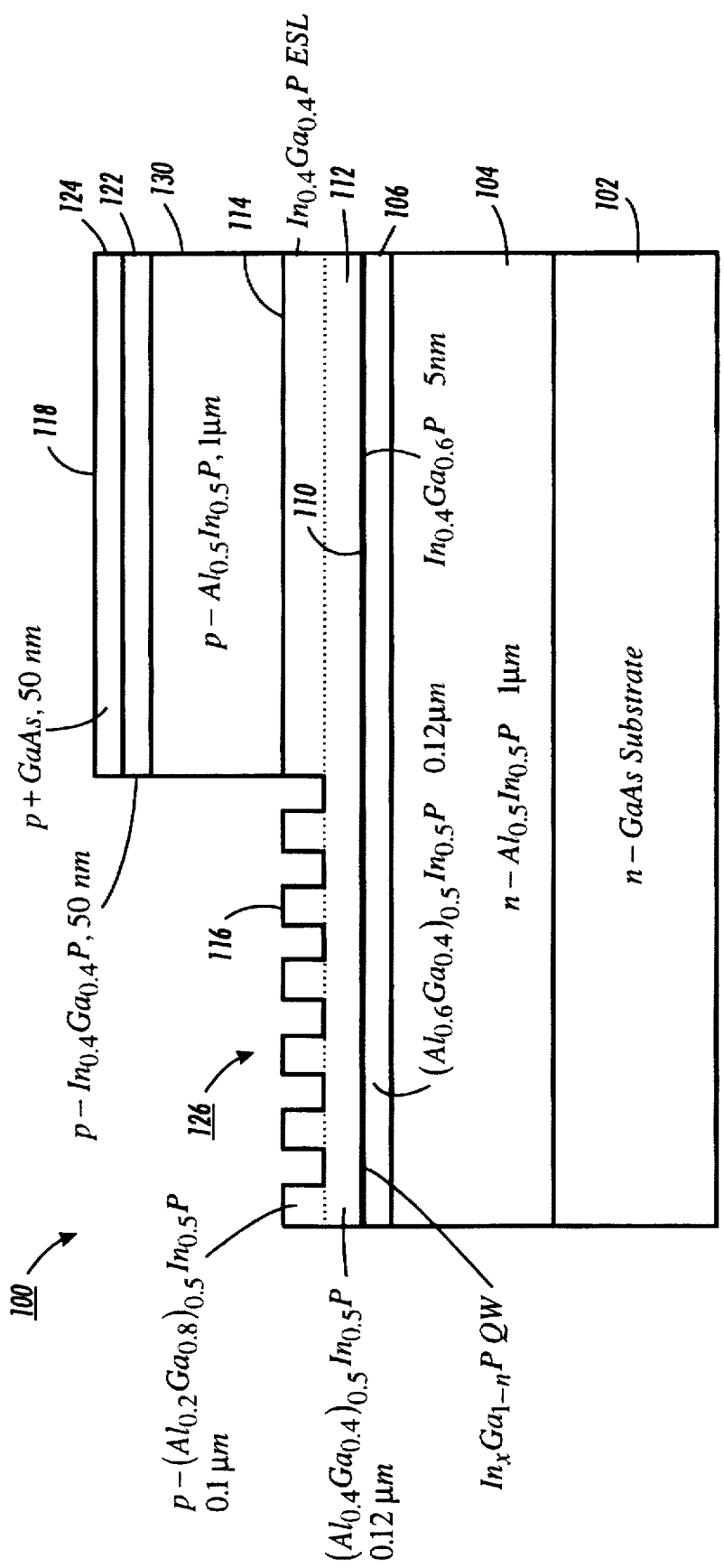
FIG. 4 is a schematic illustration of the cross-section side view of a second embodiment of a dual buried ridge semiconductor laser structure with DBRs for polarization mode selection formed according to the present invention.

The semiconductor laser structure 100 of FIG. 4 has a n-GaAs substrate 102 on which is epitaxially deposited, in a known manner such as metalorganic chemical vapor deposition (MOCVD), a succession of semiconductor layers comprising, in order, an n-$Al_{0.5}In_{0.5}P$ cladding layer 104 of 1 µm thickness, a n-$(Al_{0.6}Ga_{0.4})_{0.5}In_{0.5}P$ confinement layer 106 of 0.12 µm thickness, an $In_xGa_{1-x}P$ quantum well layer where x>0.5 to induce tensile strain for the layer with a thickness of 8 nm, a p-$(Al_{0.6}Ga_{0.4})_{0.5}In_{0.5}P$ confinement layer 110 of 0.12 µm thickness, an $In_{0.4}Ga_{0.6}P$ etch stop layer 112 of 5 nm thickness and a p-$(Al_{0.2}Ga_{0.8})_{0.5}In_{0.5}P$ upper cladding layer 114 of 0.1 µm thickness. A mask of $Si_3N_4$ or $SiO_2$ (not shown in the Figure) is deposited on the back portion 116 of the structure 100 and epitaxial deposition then continues on the unmasked front portion 118 with a p-$Al_{0.5}In_{0.5}P$ cladding ridge layer 120 of 1 µm thickness, a p-$In_{0.4}Ga_{0.6}P$ barrier reduction layer 122 of 50 nm thickness, and a p+ GaAs cap layer 124 of 50 nm thickness. The x value and thickness of the $In_xGa_{1-x}P$ quantum well layer 28 can be adjusted based on the wavelength of the emitted light beam desired.

The mask can then be removed and a DBR grating 126 is etched in the exposed upper cladding layer 114.

The etched DBR gratings 126 extend longitudinally to the quantum well layer 108 and extend only along the back portion 116 of the structure 100. The DBR grating 126 still interacts with the light emission of the quantum well layer 108 to select a single polarization mode.

One grating period for the first laser matches the gain peak of the TE-mode of the quantum well layer 108 and the other grating period for the second laser matches the gain peak of the TM-mode of the quantum well layer 108.

The remainder of the dual ridge diode laser structure 100 (not shown in FIG. 4), the electrodes for each laser and the isolation groove, can be fabricated as discussed previously.

A cleaved mirror (not shown in FIG. 4) can be used as the front facet to the laser 100 with the DBR grating 126 at the opposite end of the laser providing high reflectance (over 90 percent) for the light emitted by the quantum well active layer 108.

An alternate embodiment would be to fabricate just one grating period matching the TE mode gain peak for both ridge lasers. The ridge of the TM mode laser is tilted at a small angle relative to the DBR grating so that the actual grating period is increased to match the TM mode gain peak. This embodiment simplifies grating fabrication since only one grating has to be etched across both laser diodes.

If the active layer consists of a lattice-matched or compressively strained quantum well structure in which the heavy hole band is the ground state and TE mode predominates in the diode laser structure, only one DBR grating is needed to select the TM mode for that laser.

The diode laser structures with DBR gratings for either TE or TM polarization mode will have a single longitudinal mode emission as well as low threshold currents for light emission because of the high spectral sensitivity and high reflectivity of the DBR gratings.

The DBR grating of the present invention may be formed by holographic lithography rather than e-beam lithography. The isolation groove may be formed by reactive ion etching, ion milling or other etching means. The semiconductor diode laser structure may be fabricated by liquid phase epitaxy (LPE), molecular beam epitaxy (MBE), or other known crystal growth process.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A dual polarization semiconductor quantum well laser comprising a semiconductor structure having side-by-side first and second active regions, said first and second active regions capable of emitting light in either the TE-polarization mode or the TM-polarization mode, electrodes for individually introducing current to said first and second active regions causing said regions to emit light, a first distributed Bragg reflector grating adjacent and overlaying to said first active region for causing said first active region to emit light in the TE-polarization mode, and a second distributed Bragg reflector grating adjacent and overlaying to said second active region for causing said second active region to emit light in the TM-polarization mode.

2. The dual polarization semiconductor quantum well laser of claim 1 wherein said first and second active region is a tensile-strained quantum well layer.

3. The dual polarization semiconductor quantum well laser of claim 1 wherein the period of said first distributed Bragg reflector grating matches the peak gain of the TE-polarization mode of the wavelength of light emitted by said first active region and the period of said second distributed Bragg reflector grating matches the peak gain of the TM-polarization mode of the wavelength of light emitted by said second active region.

4. The dual polarization semiconductor quantum well laser of claim 1 wherein said first distributed Bragg reflector grating extends substantially along the full length of said first active region and said second distributed Bragg reflector grating extends substantially along the full length of said second active region.

5. The dual polarization semiconductor quantum well laser of claim 1 wherein said first distributed Bragg reflector grating extends along a portion of the length at one end of said first active region and said second distributed Bragg reflector grating extends along a portion of the length at one end of said second active region.

6. The dual polarization semiconductor quantum well laser of claim 5 wherein said first distributed Bragg reflector grating is external to said semiconductor structure and said second distributed Bragg reflector grating is external to said semiconductor structure.

7. The dual polarization semiconductor quantum well laser of claim 5 wherein said end of said first active region opposite said first distributed Bragg reflector has first reflecting means and said end of said second active region opposite said second distributed Bragg reflector has second reflecting means.

8. The dual polarization semiconductor quantum well laser of claim 1 wherein an isolation groove extends through said semiconductor structure between said first and second active regions.

9. A dual polarization semiconductor quantum well laser comprising
- a semiconductor structure having side-by-side first and second active regions, said first and second active regions capable of emitting light in either the TE-polarization mode or the TM-polarization mode,
- electrodes for individually introducing current to said first and second active regions causing said regions to emit light,
- a distributed Bragg reflector grating adjacent and overlaying to said first active region for causing said first active region to emit light in the TE-polarization mode, and
- a distributed Bragg reflector grating adjacent and overlaying at an angle to said second active region for causing said second active region to emit light in the TM-polarization mode.

10. The dual polarization semiconductor quantum well laser of claim 9 wherein said first and second active region is a tensile-strained quantum well layer.

11. The dual polarization semiconductor quantum well laser of claim 9 wherein the period of said distributed Bragg reflector grating matches the peak gain of the TE-polarization mode of the wavelength of light emitted by said first active region and the period of said distributed Bragg reflector grating at an angle matches the peak gain of the TM-polarization mode of the wavelength of light emitted by said second active region.

12. The dual polarization semiconductor quantum well laser of claim 9 wherein said distributed Bragg reflector grating extends substantially along the full length of said first active region and said distributed Bragg reflector grating extends substantially along the full length of said second active region.

13. The dual polarization semiconductor quantum well laser of claim 9 wherein said distributed Bragg reflector grating extends along a portion of the length at one end of said first active region and said distributed Bragg reflector grating extends along a portion of the length at one end of said second active region.

14. The dual polarization semiconductor quantum well laser of claim 13 wherein said distributed Bragg reflector grating is external to said semiconductor structure.

15. The dual polarization semiconductor quantum well laser of claim 13 wherein said end of said first active region opposite said distributed Bragg reflector has first reflecting means and said end of said second active region opposite said distributed Bragg reflector has second reflecting means.

16. The dual polarization semiconductor quantum well laser of claim 9 wherein an isolation groove extends through said semiconductor structure between said first and second active regions.

17. A dual polarization semiconductor quantum well laser comprising
- a semiconductor structure having side-by-side first and second active regions, said first and second active regions capable of emitting light in either the TE-polarization mode or the TM-polarization mode,
- electrodes for individually introducing current to said first and second active regions causing said regions to emit light,
- said first active region emitting light in the TE-polarization mode, and
- a distributed Bragg reflector grating adjacent and overlaying to said second active region for causing said second active region to emit light in the TM-polarization mode.

18. The dual polarization semiconductor quantum well laser of claim 17 wherein said first and second active region is a tensile-strained quantum well layer.

19. The dual polarization semiconductor quantum well laser of claim 17 wherein the period of said distributed Bragg reflector grating matches the peak gain of the TM-polarization mode of the wavelength of light emitted by said second active region.

20. The dual polarization semiconductor quantum well laser of claim 17 wherein said distributed Bragg reflector grating extends substantially along the full length of said second active region.

21. The dual polarization semiconductor quantum well laser of claim 17 wherein said first distributed Bragg reflector grating extends along a portion of the length at one end of said first active region and said second distributed Bragg reflector grating extends along a portion of the length at one end of said second active region.

22. The dual polarization semiconductor quantum well laser of claim 21 wherein said distributed Bragg reflector grating is external to said semiconductor structure.

23. The dual polarization semiconductor quantum well laser of claim 21 wherein said end of said second active region opposite said distributed Bragg reflector has reflecting means.

24. The dual polarization semiconductor quantum well laser of claim 17 wherein an isolation groove extends through said semiconductor structure between said first and second active regions.

* * * * *

UNITED STATES PATENT AND TRADEMARK OFFICE
CERTIFICATE OF CORRECTION

| | | |
|---|---|---|
| PATENT NO. | : 5,784,399 | Page 1 of 1 |
| APPLICATION NO. | : 08/774937 | |
| DATED | : July 21, 1998 | |
| INVENTOR(S) | : Decai Sun | |

It is certified that error appears in the above-identified patent and that said Letters Patent is hereby corrected as shown below:

<u>Column 1,</u>
Line 4, insert the following:
-- This invention was made with Government support under Agreement No. 70NANB2H1241 awarded by the Department of Commerce. The Government has certain rights in this invention. --.

Signed and Sealed this

Twentieth Day of June, 2006

JON W. DUDAS
*Director of the United States Patent and Trademark Office*